US009698228B2

(12) United States Patent
Kampen et al.

(10) Patent No.: US 9,698,228 B2
(45) Date of Patent: Jul. 4, 2017

(54) TRANSISTOR DEVICE WITH FIELD-ELECTRODE

(71) Applicant: Infineon Technologies AG, Neubiberg (DE)

(72) Inventors: Christian Kampen, Munich (DE); Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/976,604

(22) Filed: Dec. 21, 2015

(65) Prior Publication Data

US 2016/0181417 A1 Jun. 23, 2016

(30) Foreign Application Priority Data

Dec. 22, 2014 (DE) .................... 10 2014 119 395

(51) Int. Cl.
*H01L 29/41* (2006.01)
*H01L 29/40* (2006.01)
*H01L 29/78* (2006.01)
*H01L 29/06* (2006.01)
*H01L 29/66* (2006.01)
*H01L 29/423* (2006.01)

(52) U.S. Cl.
CPC ........ *H01L 29/407* (2013.01); *H01L 29/0696* (2013.01); *H01L 29/404* (2013.01); *H01L 29/4238* (2013.01); *H01L 29/66666* (2013.01); *H01L 29/7813* (2013.01)

(58) Field of Classification Search
CPC ............ H01L 29/7813; H01L 29/0696; H01L 29/404; H01L 29/407; H01L 29/66666
See application file for complete search history.

(56) References Cited

U.S. PATENT DOCUMENTS

| 5,637,898 | A | * | 6/1997 | Baliga | H01L 29/0878 257/330 |
| 5,998,834 | A | * | 12/1999 | Williams | H01L 29/7813 257/330 |
| 5,998,836 | A | * | 12/1999 | Williams | H01L 27/0255 257/328 |
| 6,750,508 | B2 | | 6/2004 | Omura et al. | |
| 2004/0031987 | A1 | * | 2/2004 | Henninger | H01L 29/407 257/328 |

(Continued)

OTHER PUBLICATIONS

Office Action Communication of the German Patent and Trademark Office for File Reference 102014119395.4 dated Dec. 18, 2015.

*Primary Examiner* — Fei Fei Yeung Lopez
(74) *Attorney, Agent, or Firm* — Baker Botts L.L.P.

(57) ABSTRACT

Disclosed is a transistor device. The transistor device includes a plurality of field structures which define a plurality of semiconductor mesa regions in a semiconductor body, and each of which comprises a field electrode and a field electrode dielectric; a plurality of gate structures in each semiconductor mesa region, wherein each gate structure comprises a gate electrode and a gate dielectric, and is arranged in a trench of the semiconductor mesa region; a plurality of body regions, a plurality of source regions, and a drift region. Each body region adjoins the gate dielectric of at least one of the plurality of gate structures, and is located between one of the plurality of source regions and the drift region.

20 Claims, 5 Drawing Sheets

(56) References Cited

U.S. PATENT DOCUMENTS

| | | | |
|---|---|---|---|
| 2008/0179670 A1* | 7/2008 | Willmeroth | H01L 29/402 257/340 |
| 2012/0061753 A1 | 3/2012 | Nishiwaki | |
| 2014/0084362 A1* | 3/2014 | Schloesser | H01L 29/66734 257/330 |
| 2014/0167154 A1* | 6/2014 | Nelle | H01L 29/407 257/334 |
| 2014/0346590 A1* | 11/2014 | Meiser | H01L 29/66734 257/330 |
| 2014/0357048 A1* | 12/2014 | Meiser | H01L 29/407 438/424 |

* cited by examiner

TRANSISTOR DEVICE WITH FIELD-ELECTRODE

This application claims priority to German Application Serial No. 102014119395.4 filed Dec. 22, 2014 and entitled "Transistor Device with Field-Electrode".

This disclosure in general relates to a transistor device, in particular a transistor device including an field electrode.

Transistor devices, such as MOSFETs (Metal Oxide Semiconductor Field-Effect Transistors) are widely used as switches in different types of electronic applications in the automotive, industrial, or domestic field, to name only a view. One key parameter of a transistor device is the voltage blocking capability, which defines the maximum voltage level the transistor device can withstand in an off-state (switched-off) state. Another key parameter is the specific on-resistance (Ron×A), which is the product of the electrical resistance in the on-state (switched-on state) and the chip area required to implement the transistor device.

There is a constant need in the design of transistor devices to reduce the specific on-resistance at a given voltage blocking capability.

One embodiment relates to a transistor device. The transistor device includes a plurality of field structures which define a plurality of semiconductor mesa regions in a semiconductor body, and each of which includes a field electrode and a field electrode dielectric, a plurality of gate structures in each semiconductor mesa region, wherein each gate structure comprises a gate electrode and a gate dielectric and is arranged in a trench of the semiconductor mesa region. The transistor device further includes a plurality of body regions, a plurality of source regions, and a drift region, wherein each body region adjoins the gate dielectric of at least one of the plurality of gate structures, and is located between one of the plurality of source regions and the drift region.

Examples are explained below with reference to the drawings. The drawings serve to illustrate certain principles, so that only aspects necessary for understanding these principles are illustrated. The drawings are not to scale. In the drawings the same reference characters denote like features.

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
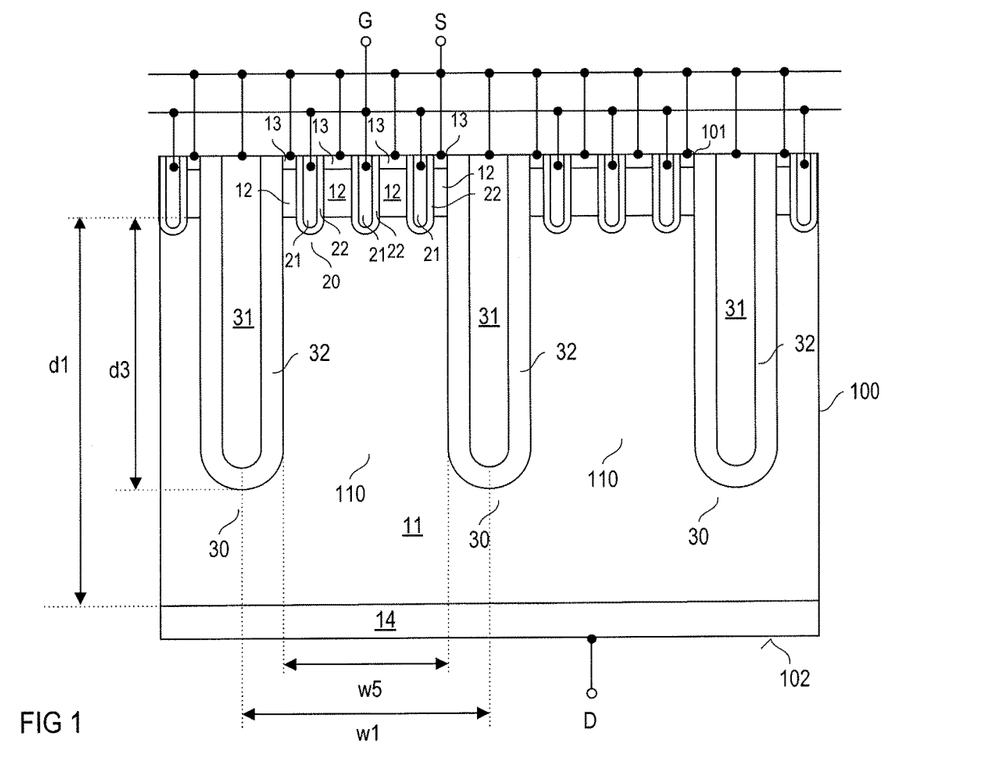
FIG. 1 illustrates a vertical cross sectional view of a transistor device according to one embodiment.

FIG. 1 shows a vertical cross sectional view of one section (portion) of a transistor device according to one embodiment. The transistor device includes a semiconductor body 100 with a first surface 101, and a second surface 102 opposite the first surface 101. The semiconductor body 100 may include a conventional semiconductor material such as, for example, silicon (Si), silicon carbide (SiC), gallium nitride (GaN), gallium arsenide (GaAs), or the like.

Referring to FIG. 1, the transistor device includes a plurality of field structures 30. These field structures 30 define a plurality of semiconductor mesa regions 110 in the semiconductor body, and each include a field electrode 31 and a field electrode dielectric 32. The field electrode dielectric 32 of each field structure dielectrically insulates the respective field electrode 31 from the semiconductor body 100. Each of these field structures 30 is arranged in a trench which extends from the first surface 101 into the semiconductor body 100. Each of the plurality of mesa regions 110 is a region of the semiconductor body 100 between two neighboring field structures 30. For the purpose of explanation, FIG. 1 only shows two semiconductor mesa regions 110 which are defined by three field structures 30. However, the overall transistor device may include up to several ten thousand, or even up to several hundred thousand semiconductor mesa regions 110.

The field electrodes 31 may include a conventional electrode material such as, for example, a metal or a highly doped polycrystalline semiconductor material, such as polysilicon. The field electrode dielectrics 32 may include a conventional dielectric material such as, for example, an oxide, a nitride, or compositions thereof.

Referring to FIG. 1, in each semiconductor mesa region 110 there is a plurality of gate structures 20. Each gate structure 20 includes a gate electrode 21, and a gate dielectric 22. The gate dielectric 22 of each gate structure dielectrically insulates the respective gate electrode 21 from the semiconductor body 100. The gate electrode 21 may include a conventional electrode material such as, for example, a metal or a highly doped polycrystalline semiconductor material, such as polysilicon. Each gate structure 20 is arranged in a trench which extends from the first surface 101 into the semiconductor body 100. In the embodiment shown in Figure, the trenches that accommodate the gate structures 20 are different from the trenches that accommodate the field structures 30. In the embodiment shown in FIG. 1, each mesa region 110 includes three gate structures 20. However, this is only an example. In general, each mesa region 110 includes two or more gate structures 20. Each of the plurality of mesa regions 110 may include the same number of gate structures 20. According to another embodiment, the number of gate structures 20 varies throughout the individual mesa regions 110.

Referring to FIG. 1, the transistor device further includes, in each mesa region 110, a plurality of body regions 12, a plurality of source regions 13, and a section of a drift region 11. Each of the plurality of body regions 12 is adjacent at least one gate electrode 21 and dielectrically insulated from the at least one gate electrode 21 by the respective gate dielectric 22. Further, each body region 12 separates a respective one of the plurality of source regions 13 from the drift region 11. According to one embodiment, each of the body regions 12 forms a pn-junction with the drift region 11.

The transistor device further includes a drain region 14. Referring to FIG. 1, the drain region 14 may adjoin the drift region 11 on a side opposite the body regions 12. According to another embodiment (not shown), a field-stop region of the same doping type as the drift region 11, but more highly doped than the drift region 11 is arranged between the drift region 11 and the drain region 14.

In the embodiment shown in FIG. 1, the individual field structures 30 are spaced apart from the drain region 14 in a vertical direction of the semiconductor body 100. According to another embodiment (not shown), the field structures 30, in the vertical direction of the semiconductor body 100, extend into the drain region 14. The "vertical direction" of the semiconductor body 100 is the direction perpendicular to the first surface 101 and the second surface 102, respectively.

Referring to FIG. 1, the individual gate electrodes 21 are electrically connected to a gate node G, the individual source regions 13 are electrically connected to a source node S, and the drain region 14 is electrically connected to a drain node D. These electrical connections are only schematically illustrated in FIG. 1. According to one embodiment, not only the source regions 13, but also the body regions 12 are connected to the source node S. However, such connections between the body regions 12 and the source node S are not illustrated in FIG. 1. These electrical connections may be implemented in wiring (metallization) layers on top of the first surface 101. Such wiring layers may be insulated from one another and from the semiconductor body 100 by insulation layers. In particular, the transistor may include a passivation (insulation) layer directly on the first surface 101. The source regions 13 and the gate electrodes 31 may be connected through vias in the passivation layer to the respective wiring layer. However, such wiring layers, vias and insulation layers are not shown in FIG. 1.

The transistor device shown in FIG. 1 is a FET (Field-Effect Transistor) and, more specifically, a MOSFET (Metal Oxide Semiconductor Field-Effect Transistor). It should be noted, that the term MOSFET as used herein denotes any type of field-effect transistor with an insulated gate electrode (often referred to as IGFET) independent of whether the gate electrode 21 includes a metal or another type of electrically conducting material, and independent of whether the gate dielectric 22 includes an oxide or another type of dielectrically insulating material. The transistor device can be implemented as an n-type MOSFET, or a p-type MOSFET. In an n-type MOSFET, the source region 13, the drift region 11, and the drain region 14 are n-doped, while the body region 12 is p-doped. In a p-type MOSFET, the source region 13, the drift region 11, and the drain region 14 is p-doped, while the body regions 12 are n-doped. Further, the MOSFET can be implemented as an enhancement MOSFET, or a depletion MOSFET. In an enhancement MOSFET, the body regions 12 adjoin the gate dielectrics 22. In a depletion MOSFET, there are channel regions (not shown) of the same doping type as the source region 13, the drift region 11, and the drain region 14 along the individual gate dielectrics 22 between the gate dielectrics 22 and the body regions 12. Each channel region along one gate dielectric extends from one source region 13 to the drift region. According to yet another embodiment, the transistor device is implemented as an IGBT (Insulated Gate Bipolar Transistor). In this case, the drain region 14 has a doping type complementary to the doping type of the drift region 11 (in an IGBT, the drain region is often referred to as emitter region).

The transistor device shown in FIG. 1 can be operated like a conventional FET. That is, the transistor device can be switched on and switched off by applying a suitable drive potential to the gate node G and the gate electrodes 21, respectively. Just for the purpose of explanation, it is assumed, that the transistor device is implemented as an n-type MOSFET. In the on-state, the drive potential applied to the gate node G generates an inversion channels along the individual gate dielectrics 22 in the body regions 12 between the source regions 13 and the drift region 11. Through these inversion channels, charge carriers (electrons in an n-type MOSFET) can flow from the source regions 13 through the body regions 12, and the drift region 11 to drain region 14. In the off-state, the drive potential applied to the gate node G is such that the inversion channels in the individual body regions 12 are interrupted. In this case, the pn-junction between the individual body regions 12 and the drift region 11 is reverse biased, so that a space charge region (depletion region) expands in the drift region 11 beginning at the individual pn-junctions. This depletion region is associated with ionized charge carriers in the drift region 11. In case of an n-type drift region 11, those ionized charge carriers are positively charged charge carriers. The field electrodes 31, which are either connected to the source node S (as shown in FIG. 1) or to the gate node G (not shown in FIG. 1), in the off-state of the transistor device, provide counter charges to a part of the ionized dopant charges in the drift region 11 in the off-state. This allows to design the drift region 11 with a higher doping concentration, at a given voltage blocking capability of the transistor device, than a conventional transistor device that has the same voltage blocking capability but no field structures. This effect is commonly known, so that no further explanations are required in this regard.

An on-resistance of the transistor device is the electrical resistance in the transistor device between the drain node D and the source node S in the on-state of the transistor device. The on-resistance is mainly defined by the doping concentration of the drift region 11, and a length d1 of the drift region 11 in the current flow direction of the transistor device. The current flow direction of the transistor device shown in FIG. 1 is the vertical direction of the semiconductor body 100. The length d1 of the drift region 11 corresponds to a shortest distance between the individual body regions 12 and the drain region 14. The length d1 of the drift region 11, and the doping concentration of the drift region 11 can be designed dependent on a desired voltage blocking capability of the transistor device. Generally, the voltage blocking capability decreases as the doping concentration of the drift region 11 increases, and the length d1 of the drift region 11 increases, respectively. Dependent on a desired voltage blocking capability of the transistor, the doping concentration may selected from a range of between 1E15 $cm^{-3}$ and 1E18 $cm^{-3}$. According to one embodiment, the length d1 is selected from a range of between 2 micrometer (μm) and 50 micrometer.

The on-resistance is further dependent on an overall channel width. The overall channel width is the overall width of the channel regions in each of the individual body regions 12. The "channel region" is a region in the body region that adjoins the gate dielectric 22 and that allows charge carriers to flow between the corresponding source region 13 and the drift region 13 when the transistor device is in the on-state. Referring to the above, the channel region may have the doping type of the body region 13. In this case, the transistor device is a normally off-device that is in the on-state when the gate electrode 12, by receiving a suitable drive potential from the gate node G, generates an inversion channel in the channel region. If the channel region has the doping type of the source region 13 (and complementary to the doping type of the body region 12) the transistor device is a normally-on device that is in the on-state when a drive potential applied to the gate electrode 12 corresponds to the drive potential of the source region 13 and the body region 12, respectively, and that is in the off-state when the gate electrode 12 receives a drive potential that depletes the channel region along the gate dielectric 22.

In the embodiment shown in FIG. 1, the channel widths of the individual channel regions in the body regions 12 are the dimensions of the individual channel regions in a direction perpendicular to the section plane shown in FIG. 1. In the transistor device shown in FIG. 1, by virtue of providing a plurality of gate structures 20 in each mesa region 110, the on-resistance is reduced as compared to a conventional transistor device in which only one gate structure is associated with one field structure (so that the number of field structures substantially corresponds to the number of gate structures).

Figure 2:
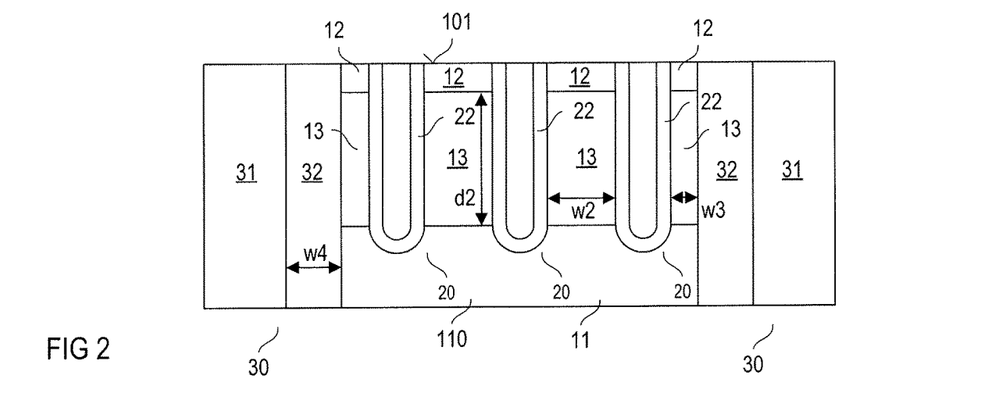
FIG. 2 shows an enlarged view of gate structures in one mesa region in the transistor device shown in FIG. 1.

FIG. 2 shows an enlarged view of a control structure with the gate structures 20, the body regions 13, and the source regions 12 in one of the plurality of mesa regions 110. In FIG. 2, only sections of the field structures 30 which define the mesa region 110 are shown. Referring to FIG. 2, each of the plurality of body regions 13 includes a length d2 in the current flow direction. This length d2 corresponds to the shortest distance between the respective source region 12 and the drift region 11. The length d2 of one body region will also be referred to as channel length in the following. According to one embodiment, the channel length d2 is selected from a range of between 100 nanometers and 700 nanometers.

Referring to FIG. 2, the semiconductor device includes two types of body regions. A first type of body region that is located between two neighboring gate structures 20, and a second type of body region that is arranged between one gate structure 20 and one field structure 30. In FIG. 2, w2 denotes a width of one first type body region, and w3 denotes a width of one second type body region. According to one embodiment, w2 is less than the channel length d2, less than 0.5 times (25%) the channel length, or even less than 0.25 times (25%) of the channel length. According to one embodiment, the width w3 of the second type body region is about half (50%) of the width w2 of the first type body regions. According to one embodiment, the first width is less than 200 nanometers.

As the widths w2, w3 of the body regions 13 are relatively small as compared to conventional transistor devices, the electrical field strengths induced by the gate electrodes 21 in the individual body regions are higher than in a conventional transistor device having the same doping concentration the body region. If using the same doping concentration of the body region than in the conventional device, the higher field strengths may result in a lower threshold voltage of the device according to the embodiments disclosed herein. The threshold voltage is the minimum voltage to be applied between the gate node G and the source node S in order to generate a conducting channel along the gate dielectric 22. Thus, in order to have the same threshold voltage than the conventional device the body regions 13 can be implemented with a higher doping concentration than the doping concentration of the body regions in a conventional device. This may result in an improved switching behavior of the transistor. In particular, the transistor according to embodiments disclosed herein may switch faster and have lower leakage currents than a conventional transistor.

Referring to the above, the transistor can be implemented as a normally-on device by forming a channel region of the same doping type as the source regions 13 in each of the body regions 12 along the gate dielectric 22. By virtue of the narrow body regions 13 it is even possible to implement the complete body regions 12 with a doping type corresponding to the doping type of the source regions 13. In this case, the body regions 13 may include regions (not shown) of a complementary doping type (of a doping type complementary to the doping type of the source regions 13) that are connected to the source node S. Those regions help to prevent an accumulation of thermally generated charge carriers in the semiconductor body.

The doping concentration of the body regions 12 is, for example, selected from a range of between $1E15$ cm$^{-3}$ and $1E18$ cm$^{-3}$. The doping concentration of the source regions 13 and the drain region 14 is, for example, selected from a range of between $1E19$ cm$^{-3}$ and $1E21$ cm$^{-3}$.

According to one embodiment, a ratio w2/d2 between the body width w2 and the body length d2 is less than 1, less than 0.5, or even less than 0.3. A ratio w3/d2 is, for example, less than 0.5, less than 0.25, or even less than 0.15. According to one embodiment, the width of one gate structure 20, that is, a distance between the two body regions 13 adjoining the gate structure 20 equals the width w2 of a first type body region, or is bigger. A thickness of the gate dielectric 22 is, for example, between 5 nanometers (nm) and 50 nanometers.

In FIG. 2, w4 denotes a thickness of the field electrode dielectric 32. According to one embodiment, this thickness w4 is between 50 nanometers and 1000 (1E3) nanometers.

In FIG. 1, w1 denotes a distance, in a horizontal direction, between the centers of two neighboring field structures. This distance, which can also be referred to as pitch, is, dependent on a width of the individual field structures and a width w5 of the mesa regions 110. In particular, the pitch equals the width of one mesa region 110 plus the width of one field structure. The width w5 of the individual mesa regions (the distance between two neighboring field electrode dielectrics 32 is, for example, between 200 nm and 2000 nm. The width of one field structure is given by twice the thickness w4 of the field electrode dielectric 32 plus a thickness of one field electrode 31. The thickness of one field electrode 31 is, for example, several 10 nanometers or several 100 nanometers.

Referring to the explanation above, the field structure 30 can be spaced apart from the drain region 14, or can extend into the drain region 14. In FIG. 1, d3 denotes a length of the individual field structures 30 below the body regions 12, that is, a distance between the body regions 12 and lower ends of the individual field structures 30. According to one embodiment, a ratio between the length d3 of the field structures 30 below the body regions 12 and the length d1 of the drift region 11 is between 0.5 and 1.1, whereas the field structure 30 is spaced apart from the drain region 14 if this ratio is below 1, and extends into the drain region 14 if this ratio is above 1. According to another embodiment, a distance between the field electrode structures and the drain region is between 1 micrometer and 5 micrometers, in particular between 2 and 4 micrometers.

Figure 3A:
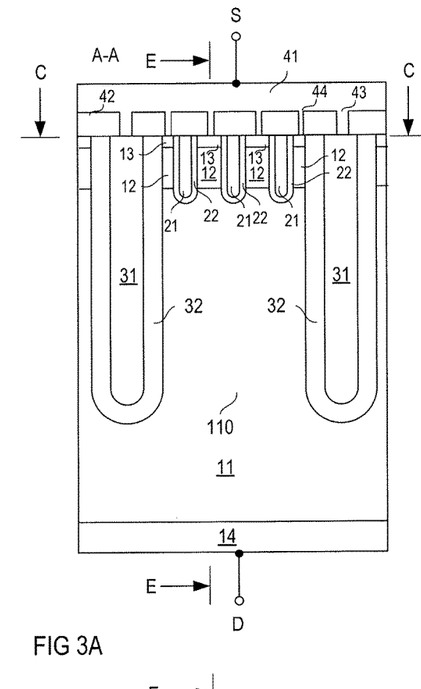
FIGS. 3A-3E show different vertical and horizontal cross sectional views of one transistor device according to one embodiment.
Figure 3B:
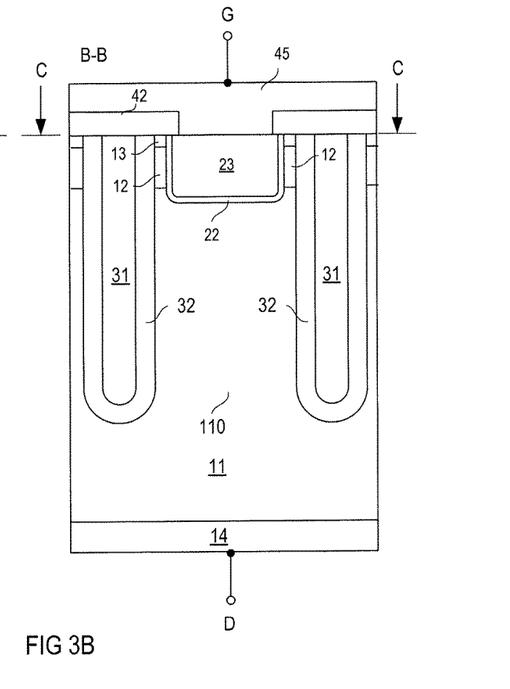
Figure 3C:
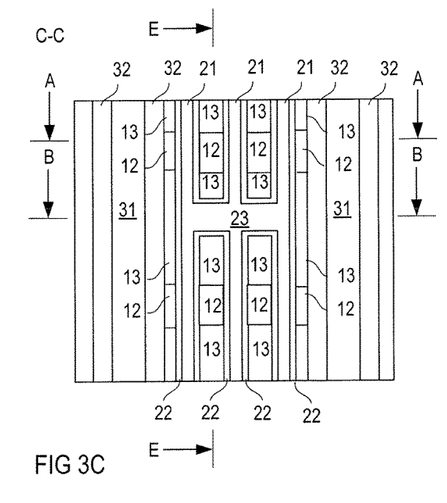
Figure 3D:
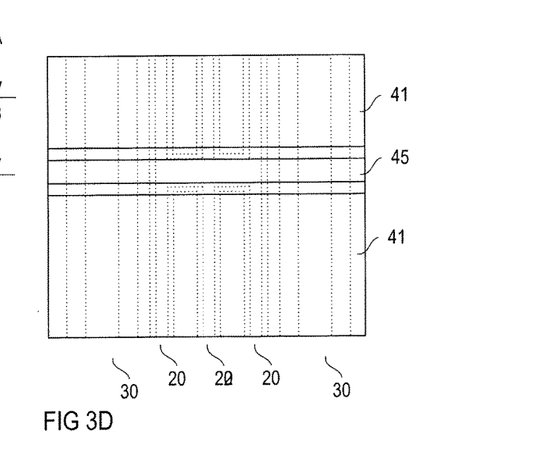
Figure 3E:
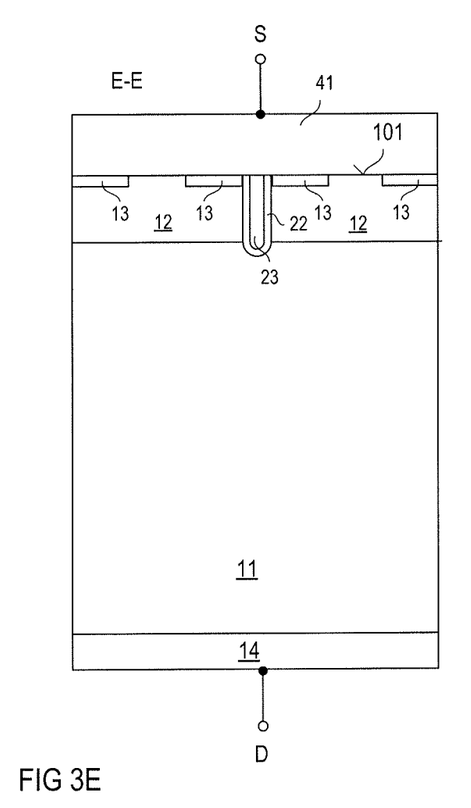

FIGS. 3A-3E show different vertical and horizontal views of one transistor device according to one embodiment. In particular, these FIGS. 3A-3D show embodiments of how the individual source regions 13 may be connected to the source node S, and the gate electrodes 21 may be connected to the gate node G. FIG. 3A shows a first vertical cross sectional view, and FIG. 3B shows a second vertical cross sectional view of the transistor device. That is, FIG. 3A shows the transistor device in a first vertical section plane A-A, and FIG. 3B shows the transistor device in a second vertical section plane B-B different from the first section plane A-A. The position of these section planes A-A and B-B is shown in FIG. 3C which shows a horizontal cross sectional view in a section plane C-C (the position of which is illustrated in FIGS. 3A and 3B). FIG. 3D shows a top view of the transistor device, and FIG. 3E shows a vertical cross sectional view in a section plane E-E that is perpendicular to the section planes A-A and B-B shown in FIGS. 3A and 3B, respectively, and that goes through one source region 13 and one body region 12.

Referring to FIG. 3A, the transistor device includes a source electrode 41 which is connected to the source node S or forms the source node S, respectively. The source electrode 41 is electrically connected to the individual source regions 13 and the field electrodes 31. In the embodiment shown in FIG. 3A, the source electrode 41 is arranged above an insulation layer 42. The insulation layer 42 includes vias above the field electrodes 31 and the source regions 13, wherein the source electrode 41 is electrically connected to the field electrodes 31 and the source regions 13 in these vias of the insulation layers 42. Referring to FIG. 3A, the source regions 13 adjoin the first surface 101, so that the source electrode 41 is electrically connected to the source regions 13 at the first surface 101. Referring to FIGS. 3C and 3E, the body regions 12 may include sections that extend to the first surface 101. In this embodiment, the source electrode 41 is also connected to the body regions 12. In those regions where the source electrode 41 is electrically connected to the body regions 12 the body regions 12 may include a contact region which is higher doped than remaining portions of the body regions 12 and which serve to ohmically connect the source electrode 41 to the body regions 12.

In the embodiment shown in FIG. 3C, the gate structures and the field structures are elongated structures in a horizontal direction of the semiconductor body 100. In this embodiment, those regions where the source regions 12 adjoin the first surface 101, and those regions where the body regions 12 adjoin the first surface 101 can be arranged alternately. According to one embodiment, a ratio between the overall surface area of those regions where the source regions 13 adjoin the first surface 101, and the overall surface area of those regions where the body regions 12 adjoin the first surface 101 is between 3:1 and 1:1, in particular between 2:1 and 1:1.

Referring to FIG. 3B, the transistor device includes a gate connection electrode 45 which is electrically connected to the individual gate electrodes 21 and which is connected to the gate node G or forms the gate node G, respectively. In the embodiment shown in FIGS. 3B and 3C, the transistor device, in those regions where the gate electrodes 21 are connected to the gate connection electrode 45, includes a connection bridge 23. The connection bridge 23, like the gate electrodes 21, is arranged in a trench and is dielectrically insulated from the semiconductor body 100 by the gate dielectric 22. The connection bridge 23 electrically interconnects the gate electrodes 21 in one mesa region and is electrically connected to the gate connection electrode 45. The gate connection electrode 45 is connected to the connection bridge 23 and the gate electrodes 21, respectively, in the region of the first surface 101 of the semiconductor body 100.

Referring to FIG. 3D, the transistor device may include several source electrodes 41 and several gate connection electrodes 45 (wherein in FIG. 3D only one gate connection electrode 45 is shown). Each source electrode is electrically connected to the source regions in several mesa regions, and each connection electrode 45 is electrically connected to the gate electrodes in several mesa regions. The individual source electrodes 41 are electrically connected to the source node S, and the individual gate connection electrodes 45 are electrically connected to the gate node G. In the embodiment shown in FIG. 3D (in which the gate structures and the field structures are shown in dotted lines) the source electrode 41 and the gate connection electrode 45 each extends in a direction that is substantially perpendicular to longitudinal directions of the gate structures 20 and the field structures 30 so that angle between the longitudinal directions of the source electrode 41 and the gate connection electrode, respectively, and the longitudinal directions of the gate structures 20 and the field structures 30, respectively, is 90°. However, this is only an example, this angle could be different from 90° such as, for example, between 30° and 90°.

Figure 4:
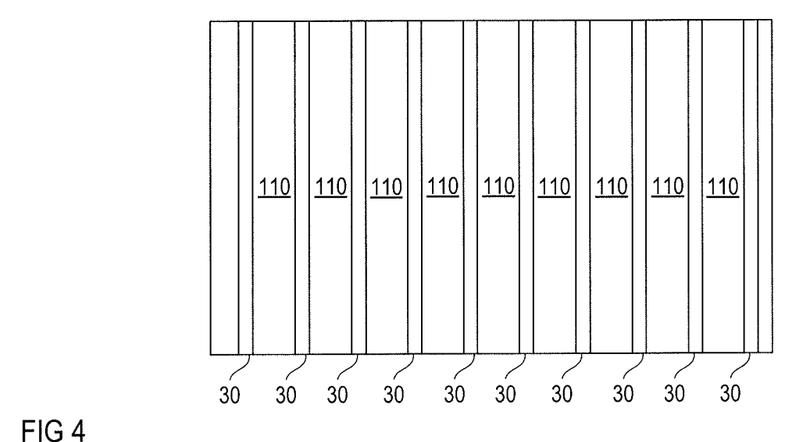
FIG. 4 illustrates one embodiment of a plurality of field structures.
Figure 5:
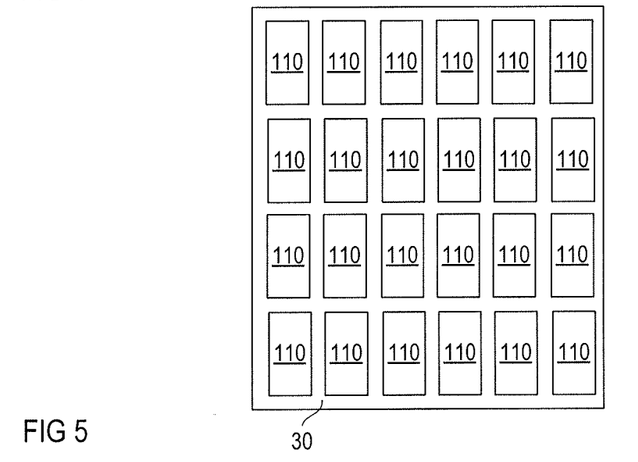
FIG. 5 illustrates another embodiment of a plurality of field structures.

FIGS. 4 and 5 show two different embodiments of how the field structures 30 may be implemented. Referring to FIG. 4, the individual field structures 30 can be implemented as elongated structures, thereby defining elongated mesa regions 110 therebetween. According to another embodiment shown in FIG. 5, the individual field structures 30 form a grid-shaped structure so as to define mesa regions 110 which, in a top view, are rectangular. In each case, the gate structures (not shown in FIGS. 4 and 5) in the individual mesa regions 110 shown in FIGS. 4 and 5 can be elongated structures, as shown in FIG. 3C.

Figure 6:
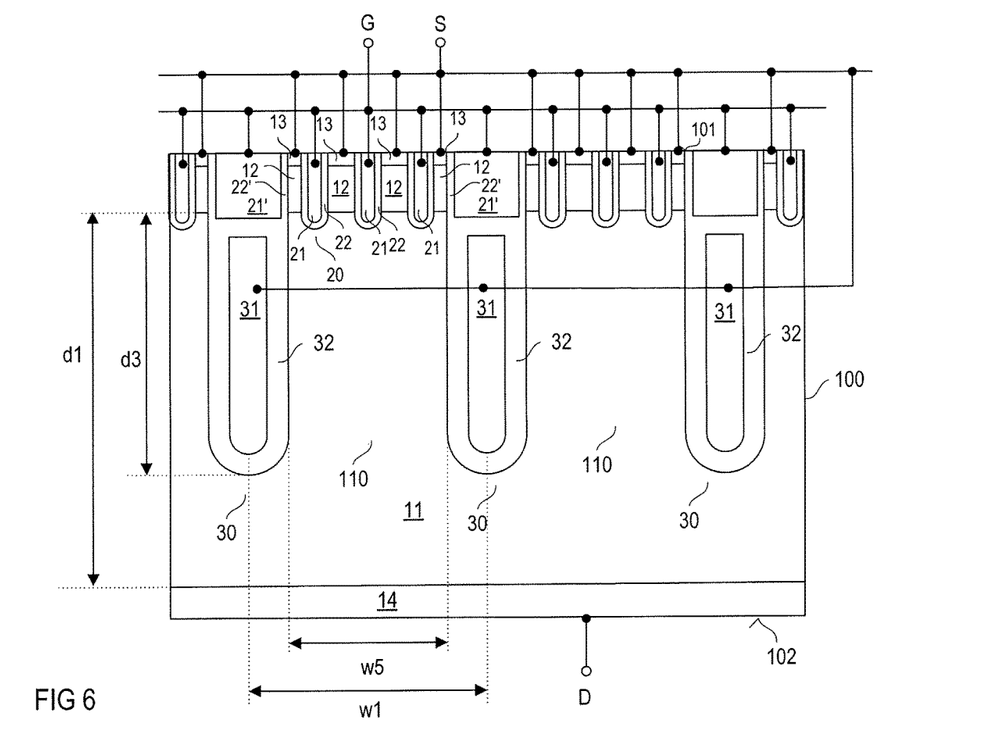
FIG. 6 illustrates a vertical cross sectional view of a transistor device according to another embodiment.

FIG. 6 shows a vertical cross sectional view of one section (portion) of a transistor device according to another embodiment. The transistor device shown in FIG. 6 is different from the transistor device shown in FIG. 1 in that the transistor device shown in FIG. 6 includes gate electrodes 21' above the field electrodes 31 in the same trenches as the field electrodes 31. These gate electrodes 21' are dielectrically insulated from the field electrodes 31 and connected to the gate node G. Like in the embodiment shown in FIG. 1, the field electrodes 31 may be connected to the source node S (as schematically shown) or to the gate node G (in this case the gate electrodes 21' and the field electrodes 31 need not be isolated). The gate electrodes 21' are adjacent those body regions 12 that were referred to as second type body regions in context with FIG. 1 and are dielectrically insulated from those body regions by gate dielectrics 22'. Concerning the material of the gate electrodes 21' everything that has been explained with reference to gate electrodes 21 applies equivalently. Concerning the material and the thicknesses of the gate dielectrics 22' everything that has been explained with reference to gate dielectrics 22 applies equivalently.

In the transistor device shown in FIG. 6, the width of the body regions 12 adjacent the gate electrodes 21' may correspond to the widths of those body regions 12 that are between two gate electrodes 21. Referring to the widths explained with reference to FIG. 2 this means that w2=w3 in the embodiment shown in FIG. 6.

The invention claimed is:

1. A transistor device, comprising:
a plurality of field structures that define a plurality of semiconductor mesa regions in a semiconductor body, and each of which comprises a field electrode and a field electrode dielectric;
a plurality of gate structures in each semiconductor mesa region, wherein each gate structure comprises a gate electrode and a gate dielectric, and is arranged in a trench of the semiconductor mesa region; and
a plurality of body regions, a plurality of source regions, and a drift region,
wherein each body region adjoins the gate dielectric of at least one of the plurality of gate structures, and is located between one of the plurality of source regions and the drift region,
wherein the plurality of body regions comprises a first group of body regions and a second group of body regions, wherein each body region of the first group is located between two neighboring gate structures of the plurality of gate structures, wherein each body region of the second group is located between one of the plurality of gate structures and one of the plurality of field structures, and wherein a width of each of the body regions of the second group is less than the width of one body region of the first group.

2. The transistor device of claim 1, further comprising a drain region, wherein the drift region is arranged between the plurality of body regions and the drain region.

3. The transistor device of claim 1, wherein the drift region is at least partially arranged in the plurality of mesa regions.

4. The transistor device of claim 3, wherein the drift region adjoins the field electrode dielectric of two neighboring field structures in each mesa region.

5. The transistor device of claim 1, further comprising:
a gate node electrically connected to each of the plurality of gate electrodes;
a source node electrically connected to each of the plurality of source regions; and
a drain node electrically connected to a drain region.

6. The transistor device of claim 5, wherein each of the plurality of field electrodes is connected to the source node.

7. The transistor device of claim 5, wherein each of the plurality of field electrodes is connected to the gate node.

8. The transistor device of claim 1, wherein each semiconductor mesa region comprises two or more gate structures.

9. The transistor of claim 1,
wherein a ratio between a first width of each of the body regions of the first group and a length of one body region in a current flow direction is less than 1, less than 0.5, or less than 0.3.

10. The transistor of claim 1,
wherein a width of each of the body regions of the second group is 50% of the width of one body region of the first group.

11. The transistor of claim 1,
wherein the plurality of body regions comprises a first group of body regions,
wherein each body region of the first group is located between two neighboring gate structures of the plurality of gate structures, and
wherein a first width of each of the body regions of the first group is less than 200 nm.

12. The transistor device of claim 1, further comprising:
a gate electrode that is arranged in at least one of the field electrode structures, and that is adjacent and dielectrically insulated from one of the plurality of body regions.

13. The transistor device of claim 1, wherein a width of each of the plurality of mesa regions is between 200 nm and 2000 nm.

14. The transistor device of claim 1, wherein the field structures of the plurality of field structures are elongated structures which are substantially parallel in a horizontal plane of the semiconductor body.

15. The transistor device of claim 1, wherein the field structures of the plurality of field structures form a grid-shaped structure in a horizontal plane of the semiconductor body.

16. The transistor device of claim 1, wherein the gate structures of the plurality of gate structures in each of the plurality of semiconductor mesa regions are substantially parallel in a horizontal plane of the semiconductor body.

17. A transistor device, comprising:
a plurality of field structures that define a plurality of semiconductor mesa regions in a semiconductor body, and each of which comprises a field electrode and a field electrode dielectric;
a plurality of gate structures in each semiconductor mesa region, wherein each gate structure comprises a gate electrode and a gate dielectric, and is arranged in a trench of the semiconductor mesa region; and
a plurality of body regions, a plurality of source regions, and a drift region,
wherein each body region adjoins the gate dielectric of at least one of the plurality of gate structures, and is located between one of the plurality of source regions and the drift region;
wherein the plurality of body regions comprises a first group of body regions and a second group of body regions,
wherein each body region of the first group is located between two neighboring gate structures of the plurality of gate structures,
wherein each body region of the second group is located between one of the plurality of gate structures and one of the plurality of field structures, and
wherein a ratio between a width of each of the body regions of the second group and a length of one body region in a current flow direction is less than 0.5.

18. The transistor of claim 17, wherein a width of each of the body regions of the second group is less than the width of one body region of the first group.

19. The transistor of claim 17, wherein a ratio between a first width of each of the body regions of the first group and a length of one body region in a current flow direction is less than 1, less than 0.5, or less than 0.3.

20. The transistor of claim 17, wherein a width of each of the body regions of the second group is 50% of the width of one body region of the first group.

* * * * *